(12) United States Patent
Greene et al.

(10) Patent No.: US 10,083,878 B1
(45) Date of Patent: Sep. 25, 2018

(54) FIN FABRICATION PROCESS WITH DUAL SHALLOW TRENCH ISOLATION AND TUNABLE INNER AND OUTER FIN PROFILE

(71) Applicant: GLOBALFOUNDRIES INC., Grand Cayman (KY)

(72) Inventors: Brian J. Greene, Wappingers Falls, NY (US); Shreesh Narasimha, Beacon, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/613,474

(22) Filed: Jun. 5, 2017

(51) Int. Cl.
| | |
|---|---|
| *H01L 21/76* | (2006.01) |
| *H01L 21/8238* | (2006.01) |
| *H01L 29/78* | (2006.01) |
| *H01L 29/66* | (2006.01) |
| *H01L 21/84* | (2006.01) |
| *H01L 29/423* | (2006.01) |
| *H01L 27/12* | (2006.01) |

(52) U.S. Cl.
CPC ........... *H01L 21/823828* (2013.01); *H01L 21/823821* (2013.01); *H01L 21/845* (2013.01); *H01L 27/12* (2013.01); *H01L 29/42384* (2013.01); *H01L 29/66545* (2013.01); *H01L 29/66553* (2013.01); *H01L 29/785* (2013.01)

(58) Field of Classification Search
CPC ................. H01L 21/823828; H01L 21/845
See application file for complete search history.

(56) References Cited

U.S. PATENT DOCUMENTS

| | | | |
|---|---|---|---|
| 9,805,987 B2* | 10/2017 | Basker | H01L 21/823807 |
| 2014/0042548 A1* | 2/2014 | Liu | H01L 27/10823 257/368 |
| 2015/0372080 A1* | 12/2015 | Akarvardar | H01L 27/0886 257/369 |
| 2016/0071932 A1* | 3/2016 | Sung | H01L 29/1033 257/369 |
| 2017/0076989 A1* | 3/2017 | Chang | H01L 21/823481 |

* cited by examiner

*Primary Examiner* — Julio J Maldonado
*Assistant Examiner* — Andre' C Stevenson
(74) *Attorney, Agent, or Firm* — Scully Scott Murphy and Presser; Frank Digiglio

(57) ABSTRACT

A self-aligned active region block mask is used to pattern and define a plurality of semiconductor fins as well as attendant shallow trench isolation (STI) structures. The block mask, a portion of which comprises a patterned fin hard mask, permits decoupling of inner and outer fin etch processes, as well as independent optimization of inner fin and outer fin dielectric properties. The fin-forming method also forestalls the creation of isolated, free-standing fins, which decreases the likelihood of mechanical damage to the fins during processing.

13 Claims, 5 Drawing Sheets

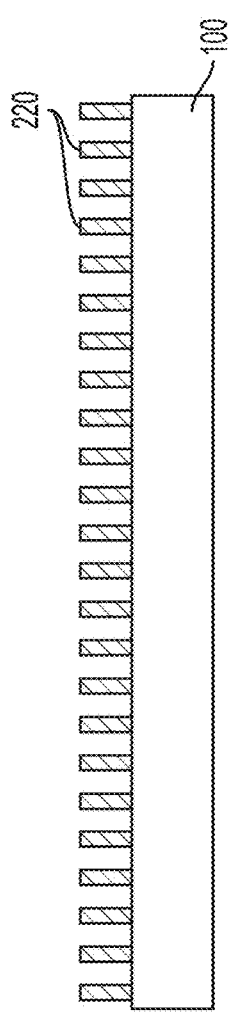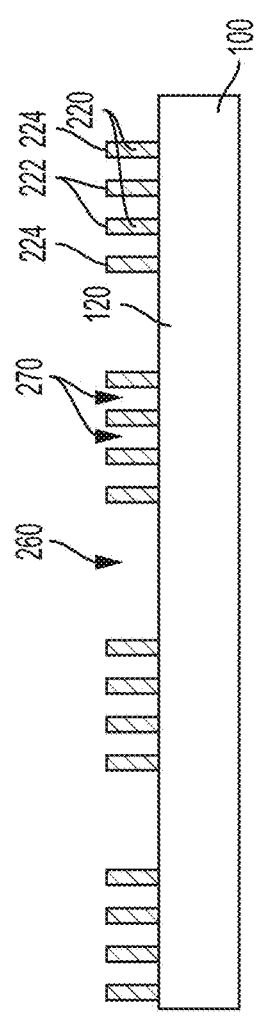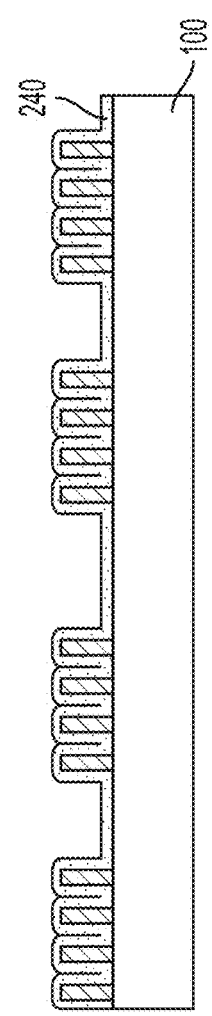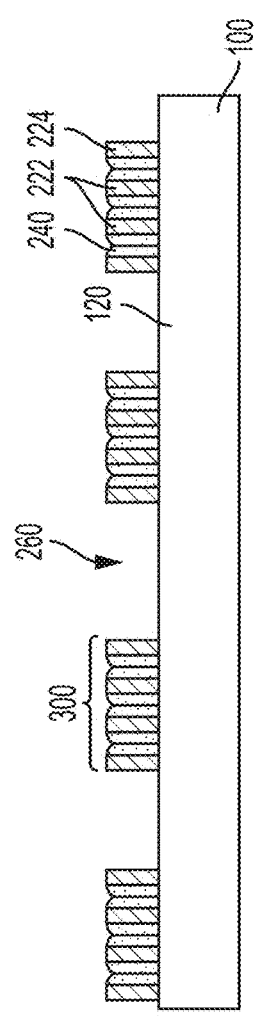

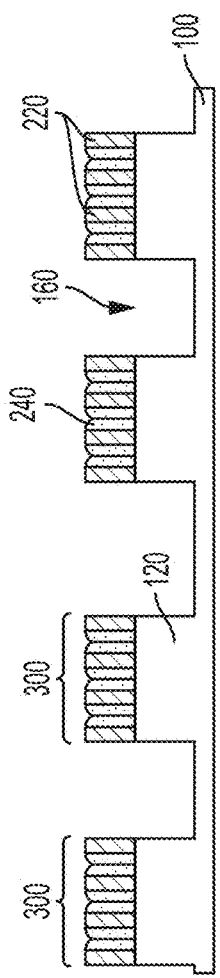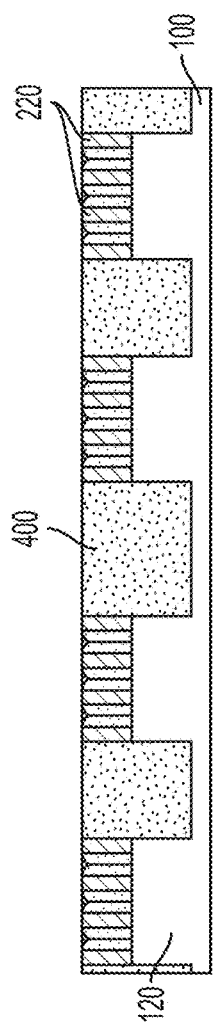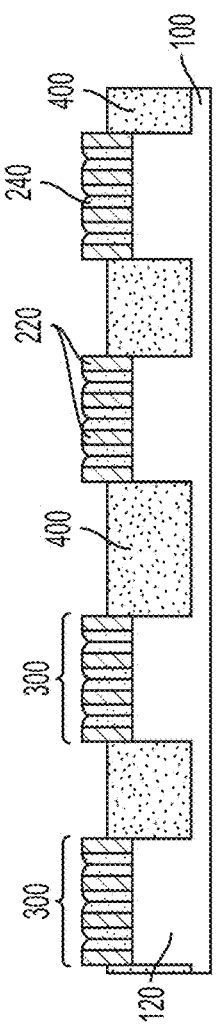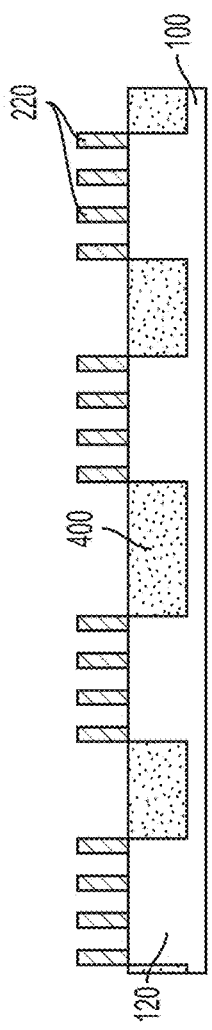

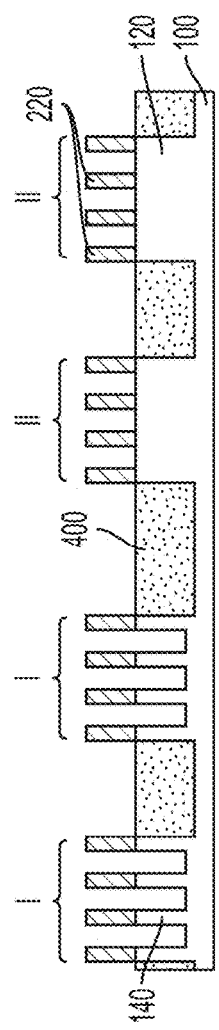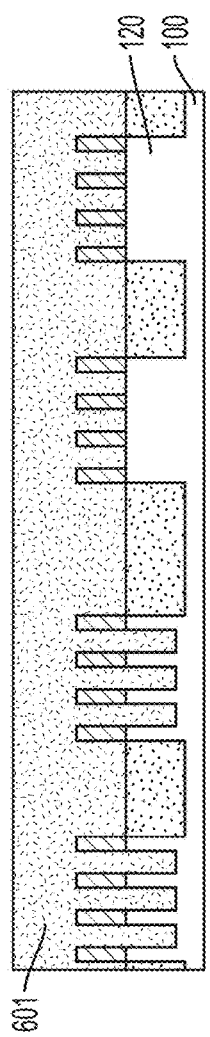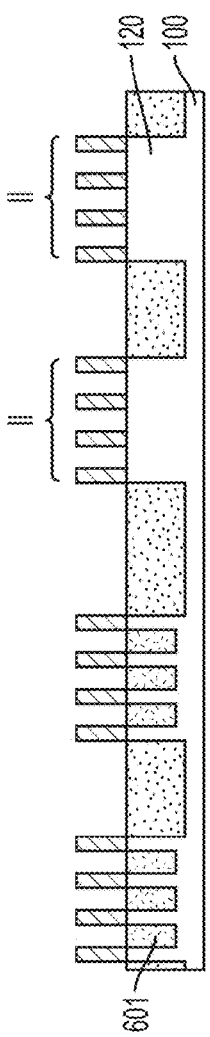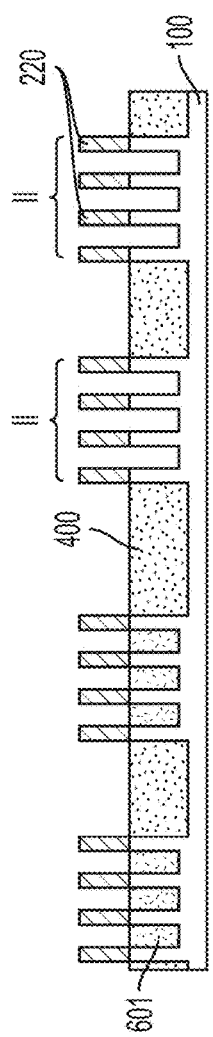

FIN FABRICATION PROCESS WITH DUAL SHALLOW TRENCH ISOLATION AND TUNABLE INNER AND OUTER FIN PROFILE

BACKGROUND

The present application relates generally to semiconductor devices, and more specifically to semiconductor fin field effect transistors (FinFETs) and their methods of production.

As bulk FinFET technologies scale, fin pitch scaling is an important aspect of both area and performance scaling. However, fin pitch scaling typically results in a significant increase in the intra-fin aspect ratio, which increases the propensity for void formation during material deposition into high aspect ratio features, the retention of residual deposits following material removal from such features, and/or the deformation of free-standing, high aspect ratio fins during rinsing, handling, etc. The formation of voids and the accumulation of unwanted etch residues may adversely affect device performance and reliability.

In view of the foregoing, it would be advantageous to provide a robust and scalable FinFET manufacturing process that minimizes defect formation and the likelihood of fin deformation during fabrication.

SUMMARY

Disclosed is a FinFET manufacturing process that avoids the formation of a free-standing fin throughout a majority of the process flow. Furthermore, the disclosed process is capable of providing well-controlled and differentiated p-type and n-type fins, which are more amenable to next generation well and punch-through stop doping strategies than conventional processes.

In accordance with embodiments of the present application, a method of forming a FinFET device includes forming a patterned hard mask over a semiconductor substrate, the patterned hard mask including at least two arrays of features. A conformal dielectric layer is formed over the patterned hard mask such that the conformal dielectric layer completely fills the gaps between adjacent features within each array.

An active area block mask is formed over the semiconductor substrate by isotropically etching the conformal dielectric layer to expose a top surface of the semiconductor substrate between adjacent arrays. Thus, the active area block mask includes the patterned hard mask and remaining portions of the conformal dielectric layer between adjacent features.

The semiconductor substrate is then etched to form a trench between adjacent arrays using the active area block masks as an etch mask. An isolation dielectric layer is formed within the trench, and the remaining portions of the conformal dielectric layer are removed. A plurality of fins are formed over the semiconductor substrate by etching the substrate using the patterned hard mask as an etch mask.

According to further embodiments, a method of forming a structure includes forming a first mask pattern over a first region of a semiconductor substrate and forming a second mask pattern over a second region of the semiconductor substrate, wherein the first mask pattern has a plurality of first mask features that define first intra-feature gaps between adjacent features, and the second mask pattern has a plurality of second mask features that define second intra-feature gaps between adjacent features.

A conformal dielectric layer is deposited over the first mask pattern and over the second mask pattern to completely fill the first and second intra-features gaps. Then, the conformal dielectric layer is removed from over the semiconductor substrate between the first mask pattern and the second mask pattern. In the present embodiment, the first mask pattern and remaining portions of the conformal dielectric layer within the first intra-feature gaps define a first block mask, and the second mask pattern and remaining portions of the conformal dielectric layer within the second intra-feature gaps define a second block mask.

A trench is formed within the semiconductor substrate between the first block mask and the second block mask, and an isolation dielectric layer is formed within the trench. By then removing conformal dielectric layer from within the first and second intra-feature gaps, the first and second mask patterns are used as an etch mask to etch the semiconductor substrate and form a plurality of fins.

According to still further embodiments, a method of forming a device includes forming first and second block masks by depositing a conformal dielectric layer over first and second mask patterns that are disposed over a semiconductor substrate, and then removing the conformal dielectric layer from over the semiconductor substrate between the first and second mask patterns. Remaining portions of the conformal dielectric layer fill first intra-feature gaps defined by first mask features within the first mask pattern and fill second intra-feature gaps defined by second mask features within the second mask pattern.

The semiconductor substrate is then etched anisotropically between the first block mask and the second block mask to form a trench therein. The trench is then filled with an isolation dielectric layer, and the conformal dielectric layer is removed from within the first and second intra-feature gaps. Using the first and second mask patterns at etch masks, the semiconductor substrate is etched to form a plurality of fins.

Thus, in various embodiments the fins can be formed by providing a semiconductor structure that includes an active area block mask disposed over a semiconductor substrate. The active area block mask comprises a patterned hard mask having two or more arrays of features, and a dielectric layer adapted to be etched selectively with respect to the patterned hard mask and disposed between adjacent features.

BRIEF DESCRIPTION OF SEVERAL VIEWS OF THE DRAWINGS

The following detailed description of specific embodiments of the present application can be best understood when read in conjunction with the following drawings, where like structure is indicated with like reference numerals and in which:

FIG. 1 is a cross-sectional view showing a semiconductor substrate with a patterned hard mask formed on an upper surface thereof;

FIG. 2 shows removal of selected portions of the patterned hard mask;

FIG. 3 shows the conformal deposition of an etch-selective layer over the patterned hard mask and the substrate;

FIG. 4 depicts the isotropic etch back of the etch-selective layer and the attendant formation of an active block mask according to one embodiment;

FIG. 5 shows etching of the semiconductor substrate to define an active region beneath the block mask;

FIG. 6 shows deposition and planarization of a shallow trench isolation (STI) layer between adjacent active regions;

FIG. 7 reveals an intermediate structure after recessing the shallow trench isolation layer and exposing the etch-selective layer;

FIG. 8 shows the structure of FIG. 7 after removal of the etch-selective layer to uncover the patterned hard mask and the semiconductor substrate within the active regions;

FIG. 13 illustrates etching of the substrate to form a plurality of fins within a first active region according to a further embodiment;

FIG. 14 shows the deposition of a first doping layer over the architecture of FIG. 13;

FIG. 15 shows partial removal of the first doping layer to form a first doped intra-fin isolation layer within the first active region;

FIG. 16 illustrates fin formation within a second active region of the semiconductor substrate;

DETAILED DESCRIPTION

Figure 9:
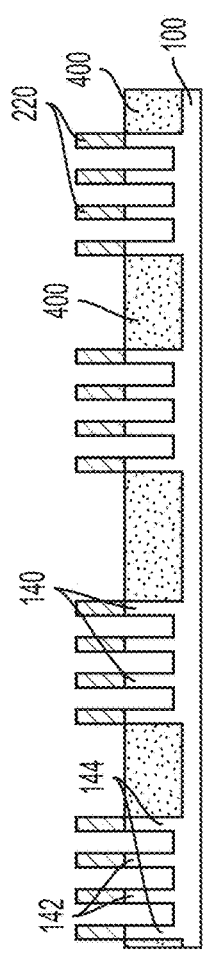
FIG. 9 shows etching of the semiconductor substrate within the active regions to form a plurality of fins.

Reference will now be made in greater detail to various embodiments of the subject matter of the present application, some embodiments of which are illustrated in the accompanying drawings. The same reference numerals will be used throughout the drawings to refer to the same or similar parts.

Disclosed is a method of manufacturing a fin field effect transistor. The fin field effect transistor (FinFET) is an attractive transistor architecture because of the relative simplicity of its manufacture compared to other double gate devices. In various embodiments, the channel of the FinFET is a thin, raised strip or fin of semiconductor material, typically silicon. A transistor gate envelops the fin so that the channel is gated on both sides of the vertical portions of the fin, which provides gate control that is superior to a planar, single gate metal oxide semiconductor field effect transistor (MOSFET).

The manufacture of FinFETs typically leverages a self-aligned process to produce extremely thin fins, e.g., 20 nm wide or less, on the surface of a substrate using selective-etching techniques. A gate structure is then deposited to contact multiple surfaces of each fin to form a multi-gate architecture. While the thin channel enables robust control of the device, its shape limits the flow of current when the device is turned on. Thus, multiple fins are typically arranged in parallel to provide higher drive strength. Multiple fins may be configured in an array, with each fin spaced apart from its nearest neighbor by a defined periodicity or pitch. In various embodiments, the fin pitch within a first array may be equal to, less than, or greater than the fin pitch within a second array.

In conjunction with a fine fin pitch architecture, disclosed is a self-aligned active region block mask that is used to pattern and define a plurality of semiconductor fins as well as an attendant shallow trench isolation (STI) structures. The block mask, which comprises a patterned hard mask and an inlaid dielectric layer, permits a decoupling of inner and outer fin etch processes, as well as independent optimization of inner fin and outer fin dielectric properties. The method also forestalls the creation of isolated, free-standing fins, which decreases the likelihood of mechanical damage to the fins during processing.

In embodiments, p-type and n-type fin etches are also decoupled, which permits independent control of the respective doping profiles and dielectric back fill, while concurrently avoiding the deposition of any fill material into a high aspect ratio feature that must later be removed from the feature. Thus, the fill materials can be chosen without regard for their etch selectivity or erosion resistance. Advantageously, free-standing, high aspect ratio fins are not exposed during a majority of the process, which contributes to process robustness.

FIGS. 1-12 are cross-sectional schematic illustrations of a block mask process flow for forming isolated fins according to one embodiment, and FIGS. 13-19 are cross-sectional schematic illustrations of a process flow adapted to provide differentiated p-type and n-type doping of fins in different device regions according to a further embodiment.

As used herein, unless the context indicates otherwise, materials and material layers may be formed or deposited by any suitable technique including, but not limited to, chemical vapor deposition (CVD), physical vapor deposition (PVD), atomic layer deposition (ALD), spin-on coating, etc. Alternatively, material layers may be formed in situ such as by thermal oxidation.

Referring to FIG. 1, an exemplary structure according to one embodiment includes a semiconductor substrate 100 and a patterned hard mask 220 disposed on an upper surface of the substrate 100. Patterned hard mask 220 defines the location and areal geometry of a plurality of fins to be formed over the substrate.

The semiconductor substrate 100 may be a semiconductor material such as silicon or a silicon-containing material, including a bulk substrate. Silicon-containing materials include, but are not limited to, single crystal Si, polycrystalline Si, single crystal silicon germanium (SiGe), polycrystalline silicon germanium, silicon doped with carbon (Si:C), amorphous Si, as well as combinations and multilayers thereof. Example silicon substrates include silicon-on-insulator (SOI) substrates, silicon-on-sapphire (SOS) substrates, and the like. As used herein, the term "single crystal" denotes a crystalline solid in which the crystal lattice of the entire sample is substantially continuous and substantially unbroken to the edges of the sample with substantially no grain boundaries.

The semiconductor substrate 100 is not limited to silicon-containing materials, however, as the substrate 100 may comprise other semiconductor materials, including Ge and compound semiconductors such as GaAs, InAs and other like semiconductors. In various embodiments, semiconductor substrate 100 is a semiconductor-on-insulator (SOI) substrate and comprises, from bottom to top, a handle portion, an isolation layer, and a semiconductor material layer. Alternatively, semiconductor substrate may comprise a bulk semiconductor substrate.

Semiconductor substrate 100 may have dimensions as typically used in the art. In various embodiments, the semiconductor substrate may be a semiconductor wafer. Example wafers diameters include, but are not limited to, 50, 100, 150, 200, 300 and 450 mm, including ranges between any of the foregoing values. The total substrate thickness may range from 250 microns to 1500 microns, although in particular embodiments the substrate thickness is in the range of 725 to 775 microns, which corresponds to thickness dimensions commonly used in silicon CMOS processing.

To form patterned hard mask 220, a hard mask layer can be deposited over a surface of the substrate 100, for example, by chemical vapor deposition (CVD). The hard mask layer can include a dielectric material such as doped or undoped silicon dioxide, silicon nitride, silicon oxynitride, a dielectric metal nitride, or a dielectric metal oxide. Further example dielectric materials suitable to form the hard mask layer include SiC, SiCO, SiCOH, and SiCH compounds, carbon-doped oxides, inorganic oxides, inorganic polymers, organic polymers such as polyamides, diamond-like carbon (DLC), amorphous hydrogenated carbon (α-C:H), and silicon boron nitride (SiBN). The thickness of the hard mask layer can be from 20 to 100 nm, e.g., 20, 40, 60, 80 or 100 nm, including ranges between any of the foregoing values, although lesser and greater thicknesses can also be employed.

The hard mask layer can include one or more layers that can be used to form an etch mask for defining active regions in the semiconductor substrate and the attendant formation of fins within the active regions. In certain embodiments, the hard mask layer is adapted to withstand etching of the semiconductor substrate and/or etching of silicon dioxide.

As will be appreciated, patterned hard mask 220 may be formed by patterning and etching the hard mask layer. The patterning process may comprise photolithography, which includes forming a layer of photoresist material (not shown) atop the hard mask layer. The deposited photoresist is then subjected to a pattern of irradiation, and the exposed photoresist material is developed utilizing a conventional resist developer. The pattern provided by the patterned photoresist material is thereafter transferred into the hard mask layer utilizing at least one pattern transfer etching process.

The pattern transfer etching process is typically an anisotropic etch. In certain embodiments, a dry etching process such as, for example, reactive ion etching can be used. In other embodiments, a wet chemical etchant can be used. In still further embodiments, a combination of dry etching and wet etching can be used. After etching the hard mask layer, the photoresist can be removed by ashing, or can be consumed during the etch process. The patterned hard mask may be referred to as a fin dielectric cap.

After patterning the hard mask, selected portions of the patterned hard mask 220 can be removed, e.g., from regions 260 where fins are not to be formed. A further photoresist layer (not shown) can be applied over the patterned hard mask layer, and can be lithographically patterned to form openings exposing portions of the patterned hard mask. A selective etch can then be used to remove the exposed portions of the patterned hard mask. Referring to FIG. 2, the patterned hard mask 220 includes inner fin-defining features 222 and outer fin-defining features 224. In certain embodiments, a width of the pattern hard mask features may range from 4 to 30 nm, e.g., 4, 6, 8, 10, 12, 15, 20 or 30 nm, including ranges between any of the foregoing values.

Referring to FIG. 3 and FIG. 4, a self-aligned active region block mask 300 can be formed by depositing a conformal dielectric layer 240 over the patterned hard mask 220 and then isotropically etching the conformal dielectric layer. As illustrated in FIG. 3, the as-deposited conformal dielectric layer 240 blankets the top and sidewall surfaces of the patterned hard mask 220 as well as the exposed top surface of the substrate 100.

In embodiments, conformal dielectric layer 240 has a step coverage of nearly 100%. That is, the thickness of conformal layer is substantially constant over horizontal and vertical surfaces. In embodiments, the conformal dielectric layer 240 has a thickness of at least half of a width of the gap 270 between two adjacent features 222, 224 of the patterned hard mask 220 such that the conformal layer completely fills the gaps 270 between adjacent features 222, 224, i.e., the conformal layer pinches off between adjacent features without void formation.

As will be appreciated, an isotropic etch can be used to remove portions of the conformal layer 240 from horizontal surfaces over and between block masks 300, while geometric effects slow the effective etch rate between adjacent features of the patterned hard mask 220. Thus, following the isotropic etch, the conformal dielectric layer 240 may fill the gaps between adjacent features.

Etching of the conformal dielectric layer 240 can be prolonged after horizontal portions of the conformal dielectric layer are removed so that vertical portions of the conformal dielectric layer on sidewalls of the outer features 224 of the patterned hard mask 220 are removed. As used here, "horizontal" refers to a general direction along a primary surface of a substrate, and "vertical" is a direction generally orthogonal thereto. Furthermore, "vertical" and "horizontal" are generally perpendicular directions relative to one another independent of orientation of the substrate in three-dimensional space. In embodiments, the self-aligned, active-region block mask 300 can be defined with an isotropic etch such as a wet chemical etch of the conformal dielectric layer 240.

By way of example, the conformal dielectric layer 240 can be silicon dioxide or a low dielectric constant material such as fluorinated silicon dioxide, and can be deposited using chemical vapor deposition, for example. According to various embodiments, the conformal dielectric layer 240 completely fills gaps 270 and may have a thickness of 5 to 50 nm, e.g., 5, 10, 20, 40 or 50 nm, including ranges between any of the foregoing values.

Referring to FIG. 5, the pattern in the block mask 300 is then transferred into the semiconductor substrate 100. For example, using the block mask 300 as a mask, a wet etch or reactive ion etching (RIE) may be used to etch unmasked portions of the semiconductor substrate 100. Active regions 120 of the substrate 100 are defined beneath the block mask 300.

Etching of the semiconductor substrate forms a trench 160 corresponding to each opening in the block mask 300. The depth of the trench 160, which corresponds to the height (H) of the fins that will be defined within the active regions 120, may range from 10 to 120 nm, e.g., 10, 20, 30, 40, 50, 60, 70, 80, 90, 100, 110 or 120 nm, including ranges between any of the foregoing values. The sidewalls of a trench may be vertical or inclined at an angle with respect to a vertical axis of 1 to 10°, e.g., 1, 2, 4, 5 or 10°, including ranges between any of the foregoing values. In certain embodiments, isotropic etching of the semiconductor substrate allows for independent control of the trench depth and taper of the trench sidewalls.

FIG. 6 shows a structure following deposition and planarization of a shallow trench isolation (STI) layer 400 within each trench 160 between active regions 120. Shallow trench isolation regions can be formed by filling trenches 160 with a dielectric such as silicon dioxide. Alternatively, the trenches 160 can be lined with a silicon dioxide liner formed by a thermal oxidation process and then filled with additional silicon dioxide or another suitable dielectric material. By way of example, in particular embodiments, a thin oxide layer is formed upon the trench floor and upon the trench sidewalls, and then a trench dielectric is deposited into the trench and over the block masks to substantially fill the trench. The trench dielectric may be formed by chemical vapor deposition (CVD) or atomic layer deposition (ALD) using TEOS as a precursor, for example.

An alternative deposition process uses a flowable oxide such as a hydrogen silsequioxane-based flowable oxide ("HSQ") to fill the trenches 160. The HSQ can be spin-on deposited in liquid form. After deposition, the HSQ can be heated which causes it to reflow and produce a substantially planar upper surface.

Referring still to FIG. 6, excess portions of the STI material can be removed from above the top surface of the block mask 300, for example, by chemical mechanical polishing to form a planarized structure. "Planarization" is a material removal process that employs at least mechanical forces, such as frictional media, to produce a substantially two-dimensional surface. Chemical mechanical polishing (CMP) is a material removal process that uses both chemical reactions and mechanical forces to remove material and planarize a surface. In certain embodiments, patterned hard mask 220 and/or conformal dielectric layer 240 may serve as an etch stop for a planarization process used to remove excess STI material.

The filled trenches laterally surround and define the size and location of the active regions 120. In certain embodiments, the material(s) filling the trenches can have a compressive or tensile stress.

Referring to FIG. 7, the STI layer 400 can be vertically recessed to a level between the top surface of the block mask 300 and the top surface of the active region 120 by a recess etch in order to expose the conformal dielectric layer 240 within the block mask 300. The recess etch of the STI layer can employ an anisotropic etch such as a reactive ion etch, an isotropic etch such as a wet etch, or a combination thereof. The recess etch can be selective to the materials of the block mask 300.

In one embodiment, the shallow trench isolation layer 400 can include a dielectric material different from the dielectric material used to form the conformal dielectric layer 240. For example, the shallow trench isolation layer 400 can include silicon dioxide while the conformal dielectric layer can include silicon nitride.

Referring to FIG. 8, a selective etch is then used to remove the conformal dielectric layer 240, e.g., from within gaps 270, to expose the patterned hard mask 220 and uncover the semiconductor substrate within the active regions. As will be appreciated, fins are then formed by patterning and etching the semiconductor substrate 100, i.e., a top portion of the semiconductor substrate, using the patterned hard mask 220 as a masking layer. In the foregoing process flow, block mask 300 comprising patterned hard mask 220 and conformal layer 240 is used to define the shallow trench isolation layer 400 prior to forming the fins.

The etching process used to form the fins is typically an anisotropic etch. In certain embodiments, a dry etching process such as, for example, reactive ion etching can be used. In other embodiments, a wet chemical etchant can be used. In still further embodiments, a combination of dry etching and wet etching can be used. FIG. 9 shows etching of the semiconductor substrate 100 within the active regions 120 to form fins 140. In various embodiments, the fins are contiguous with the substrate 100 and are laterally surrounded by shallow trench isolation layers 400. Fins 140 include inner fins 142, which are disposed directly beneath inner fin-defining features 222, and outer fins 144, which are disposed directly beneath outer fin-defining features 224. Inner fins 142 are arranged at a minimum fin-to-fin spacing (d), while outer fins 144 are semi-isolated in comparison.

As used herein, a "fin" refers to a contiguous semiconductor material that includes a pair of opposing sidewalls such as a pair of vertical sidewalls that are parallel to each other. As used herein, a surface is "vertical" if there exists a vertical plane from which the surface does not deviate by more than three times the root mean square roughness of the surface.

In various embodiments, a fin may include at least one tapered sidewall, e.g., such that a lower portion of the fin is wider than an upper portion of the fin. The opposing sidewalls of a fin may be vertical or inclined at an angle with respect to a vertical axis of 1 to 10°, e.g., 1, 2, 4, 5 or 10°, including ranges between any of the foregoing values. The opposing sidewalls of a fin may be inclined at the same relative angle (e.g., −2° and +2° with respect to a vertical axis) or at different angles (e.g., 0 and 2° with respect to a vertical axis).

According to various embodiments, fin profile angle control can be achieved for both inner fins 142 and outer fins 144, where outer sidewalls of the outer fins 144 are defined during formation of trench 160, while inner sidewalls of the outer fins 144 and opposing sidewalls of the inner fins 142 are defined during pattern transfer from the patterned hard mask 220.

Each of a plurality of fins 140 can comprise a single crystal semiconductor material that extends along a lengthwise direction. As used herein, a "lengthwise direction" is a horizontal direction along with an object extends the most. A "widthwise direction" (W) is a horizontal direction that is perpendicular to each of a fin height (H) and a lengthwise direction.

Each fin has a height (H) that may range from 10 nm to 120 nm and a width (W) that may range from 4 nm to 30 nm. Other heights and widths that are less than or greater than the ranges mentioned can also be used. The fins 140 may have an aspect ratio (H/W) ranging from 1 to 5, e.g., 1, 1.5, 2, 3, 4 or 5, including ranges between any of the foregoing values. Plural fins may have identical or substantially identical dimensions, i.e., height and/or width. As used herein, substantially identical dimensions vary by less than 10%, e.g., less than 5%, 2% or 1%.

In structures comprising plural fins, i.e., a fin array, each fin may be spaced apart from its nearest neighbor by a periodicity or pitch (d) of 15 nm to 100 nm, e.g., 15, 20, 25, 30, 40, 50, 75 or 100 nm, including ranges between any of the foregoing values. Such plural fins are typically oriented parallel to each other and perpendicular to the library logic flow of a circuit.

In various embodiments, each of a plurality of semiconductor fins 140 extends along a lengthwise direction with a substantially rectangular vertical cross-sectional shape. As used herein, a "substantially rectangular shape" is a shape that differs from a rectangular shape only due to atomic level roughness that does not exceed 2 nm. The substantially rectangular vertical cross-sectional shape is a shape within a plane including a vertical direction and a widthwise direction.

Figure 10:
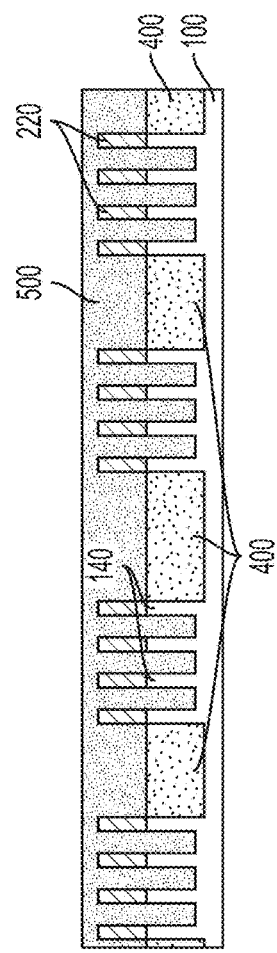
FIG. 10 shows the deposition of an intra-fin isolation layer.

Referring to FIG. 10, an intra-fin isolation layer 500 is deposited over the patterned hard mask 220, shallow trench isolation layer 400, and over exposed surfaces of the fins 140, i.e., between adjacent fins 140. The intra-fin isolation layer 500 may include a dielectric material such as silicon dioxide, silicon nitride or silicon oxynitride. In various embodiments, as discussed further below, the intra-fin isolation layer 500 may further include a dopant that can be diffused into the fins in order to form doped fins.

Figure 11:
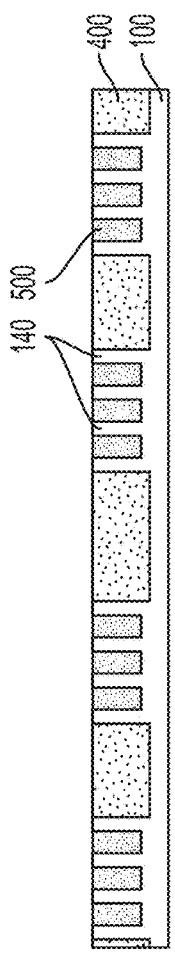
FIG. 11 shows planarization of the structure of FIG. 10 and the accompanying removal of the patterned hard mask.
Figure 12:
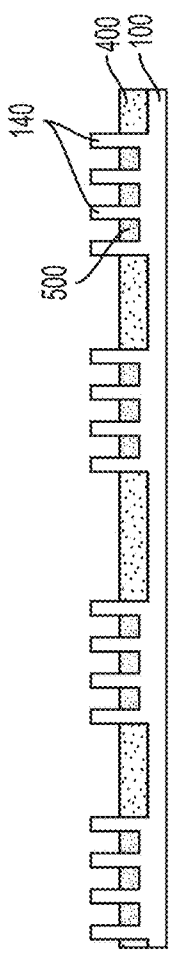
FIG. 12 shows partial removal of the intra-fin isolation layer and the shallow trench isolation layer to reveal a plurality of fins according to one embodiment.

As shown in FIG. 11, following deposition of the intra-fin isolation layer, chemical mechanical polishing and/or a selective etching step can then be used to planarize the structure, which in the illustrated embodiment includes removal of the patterned hard mask. For instance, a polishing step can be used to remove a portion of the patterned hard mask, followed by an etching step to remove the remaining portion of the patterned hard mask. Subsequently, referring to FIG. 12, a recess etch of the intra-fin isolation layer 500 and shallow trench isolation layer 400 can expose fins 140. The extent of the recess etch can be used to control the exposed height of the fins so as to define a channel length of a FinFET device.

As will be appreciated by those skilled in the art, a gate stack (not shown) comprising a gate dielectric and a gate conductor can be formed over the fins, and suitable contacts formed to source/drain and gate regions.

In a further embodiment, and with reference to FIGS. 13-19, p-type and n-type FinFETs can be fabricated by independent formation and doping of p-type and n-type fins. A doped region may be formed by adding dopant atoms to an intrinsic semiconductor. This changes the electron and hole carrier concentrations of the intrinsic semiconductor at thermal equilibrium. A doped region may be p-type or n-type.

As used herein, "p-type" refers to the addition of impurities to an intrinsic semiconductor that creates a deficiency of valence electrons. In a silicon-containing substrate, example p-type dopants, i.e., impurities, include but are not limited to boron, aluminum, gallium, and indium. As used herein, "n-type" refers to the addition of impurities that contribute free electrons to an intrinsic semiconductor. In a silicon-containing substrate, example n-type dopants, i.e., impurities, include but are not limited to, antimony, arsenic, and phosphorus. A p-type dopant is used to manufacture a PFET and an n-type dopant is used to manufacture an NFET.

After using a block mask 300 to define shallow trench isolation regions 400 and removing conformal dielectric layer 240 from the block mask structure, as illustrated in the process flow associated with FIGS. 1-8, as an alternative embodiment to the architecture realized in FIG. 9, and referring now to FIG. 13, a portion of substrate 100 can be etched to form a plurality of fins 140 within first active regions (I). That is, fins are formed within first active regions (I) while remaining portions of the substrate are masked by a photoresist or hard mask layer (not shown) such that fins are not formed within second active regions (II).

Then, as shown in FIG. 14, a first intra-fin doping layer 601 is deposited over the architecture of FIG. 13. First intra-fin doping layer 601 can be deposited between adjacent fins 140 within first active regions (I) in the manner analogous to that described above with respect to intra-fin isolation layer 500. By way of example, first intra-fin doping layer 601 may comprise a p-type dopant such as, for example, a borosilicate glass (BPSG).

Referring to FIG. 15, an isotropic etch is used to partially remove the first intra-fin doping layer 601. In various embodiments, a recess etch of the first intra-fin doping layer 601 does not expose sidewall surfaces of fins 140 within first active region(s) (I). In such embodiments, for example, the recessed intra-fin doping layer 601 may be co-planar with a top surface of the fins 140 within first active region(s) (I). In various embodiments, the first intra-fin doping layer 601 is recessed to expose a top surface of the active regions 120 within second active regions (II).

Figure 17:
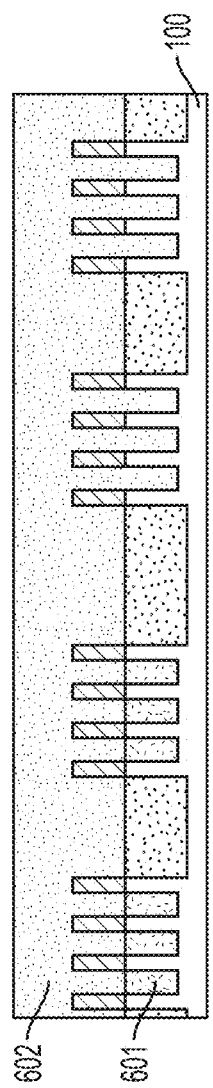
FIG. 17 shows the deposition of a second doping layer over the architecture of FIG. 16.

After forming a first intra-fin doping layer between fins within a first active region, FIG. 16 illustrates fin formation within one or more second active regions (II) of the semiconductor substrate. Fins are formed within second active regions (II) while first active region(s) (I) are masked by a photoresist or hard mask layer (not shown). Referring to FIG. 17, a second intra-fin doping layer 602 is deposited over the architecture of FIG. 16, i.e., between adjacent fins 140 within second active regions (II). Second intra-fin doping layer 602 may comprise an n-type dopant such as, for example, phosphosilicate glass (PSG).

Figure 18:
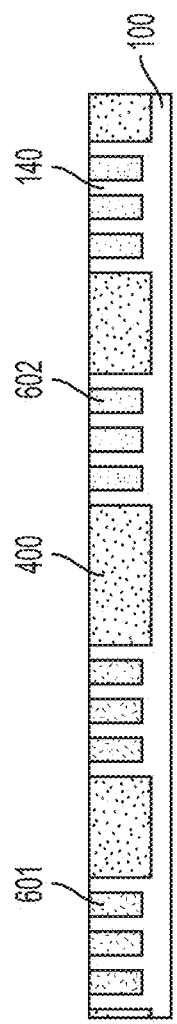
FIG. 18 shows a planarized architecture after removal of the hard mask, and including a first intra-fin doping layer comprising a first doping layer within the first active region and a second intra-fin doping layer comprising a second doping layer within the second active region.

Then, referring to FIG. 18, a planarized architecture can be formed to include a first intra-fin doping layer within the first active region (I) and a second intra-fin doping layer within the second active region (II). In the illustrated embodiment, a CMP step is used to form a planarized architecture during which step the patterned hard mask is removed.

Figure 19:
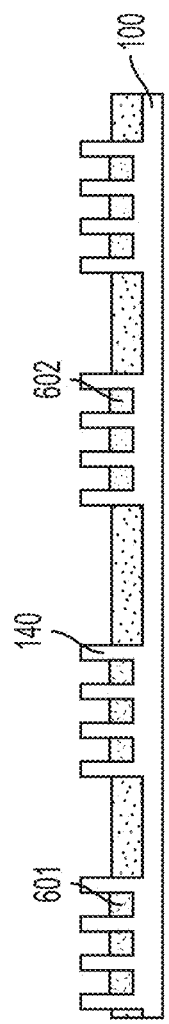
FIG. 19 shows partial removal of the intra-fin doping layers and the shallow trench isolation layer to reveal a plurality of fins according to various embodiments.

Subsequently, referring to FIG. 19, a recess etch of the first and second intra-fin doping layers 601, 602 and shallow trench isolation layer 400 can reveal fins 140. The extent of the recess etch can be used to control the exposed height of the fins, i.e., the channel length of a FinFET device.

In certain embodiments, the recess etch of the first and second intra-fin doping layers 601, 602 can be performed simultaneously. In such embodiments, the etch rate of the first intra-fin doping layer 601 and the etch rate of the second intra-fin doping layer 602 may be comparable and the resulting channel lengths within first and second active regions may be comparable. Alternatively, the etch rate of the first intra-fin doping layer 601 may be different from the etch rate of the second intra-fin doping layer 602. Accordingly, the revealed fin heights and hence the channel lengths within first and second active regions may be different. The channel length within the first active region may be greater than the channel length within the second active region, or vice versa.

In certain embodiments, the recess etch of the first intra-fin doping layer 601 and the recess etch of the second intra-fin doping layer 602 may be performed in succession using, for example, a hard mask or layer of photoresist (not shown) to alternately block a doping layer within one region while performing a recess etch of the exposed doping layer in the unblocked region. In such an approach, the recess etch and hence the channel length within each of the first and second active regions may be independently controlled.

Activation annealing may be performed to activate the dopants within select regions of the fins, e.g., within source/drain regions of the fins. For instance, a drive-in anneal (e.g., 600° C. to 1400° C.) can be used to diffuse dopant species from within first and second intra-fin doping layers 601, 602 into respective fins 140 and generate a desired dopant profile. That is, a dopant species incorporated into first intra-fin doping layer 601 can be diffused into fins within first active region and a dopant species incorporated into second intra-fin doping layer 602 can be diffused into fins within second active region.

The dopant profile within the fins 140 may be constant or variable. For example, after annealing, the dopant concentration within the fins may vary laterally, i.e., along a widthwise direction of the fins, with a minimum dopant concentration (e.g., $1\times10^{19}$ to $<5\times10^{22}$ atoms/cm$^3$) along a central axis of the fins and a maximum dopant concentration (e.g., $>1\times10^{19}$ to $5\times10^{22}$ atoms/cm$^3$) at opposing sidewall surfaces thereof. In further embodiments, the dopant concentration within the fins may vary along a lengthwise direction of the fins. Activation annealing may be performed before or after recess etching of the first and second intra-fin doping layers 601, 602.

As used herein, the singular forms "a," "an" and "the" include plural referents unless the context clearly dictates otherwise. Thus, for example, reference to a "fin" includes examples having two or more such "fins" unless the context clearly indicates otherwise.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred. Any recited single or multiple feature or aspect in any one claim can be combined or permuted with any other recited feature or aspect in any other claim or claims.

It will be understood that when an element such as a layer, region or substrate is referred to as being formed on, deposited on, or disposed "on" or "over" another element, it can be directly on the other element or intervening elements may also be present. In contrast, when an element is referred to as being "directly on" or "directly over" another element, no intervening elements are present.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a fin that comprises a semiconductor material include embodiments where a fin consists essentially of a semiconductor material and embodiments where a fin consists of a semiconductor material.

It will be apparent to those skilled in the art that various modifications and variations can be made to the present invention without departing from the spirit and scope of the invention. Since modifications, combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. A method of forming a FinFET device, comprising:
   forming a patterned hard mask over a semiconductor substrate, the patterned hard mask including at least two arrays of features;
   forming a conformal dielectric layer over the patterned hard mask, the conformal dielectric layer completely filling a gap between adjacent features within each array;
   defining an active area block mask over the semiconductor substrate by isotropically etching the conformal dielectric layer to expose a top surface of the semiconductor substrate between adjacent arrays, the active area block mask comprising the patterned hard mask and remaining portions of the conformal dielectric layer between adjacent features;
   etching the semiconductor substrate to form a trench between adjacent arrays using the active area block mask as an etch mask;
   forming an isolation dielectric layer within the trench;
   removing the remaining portions of the conformal dielectric layer;
   etching the substrate using the patterned hard mask as an etch mask to form a plurality of fins;
   forming a first intrafin isolation layer between adjacent fins within a first region of the substrate; and
   forming a second intrafin isolation layer between adjacent fins within a second region of the substrate, wherein the first intrafin isolation layer comprises a p-type dopant and the second intrafin isolation layer comprises an n-type dopant.

2. The method of claim 1, further comprising etching the first intrafin isolation layer such that a top surface of the first intrafin isolation layer is below a top surface of the fins.

3. The method of claim 1, wherein the patterned hard mask comprises silicon nitride and the conformal dielectric layer comprises silicon dioxide.

4. The method of claim 1, wherein the remaining portions of the conformal dielectric layer substantially fill intra feature gaps within each array prior to removing the remaining portions of the conformal dielectric layer.

5. The method of claim 1, wherein the plurality of fins comprises a plurality of fin arrays, each fin array including a pair of outer fins having a sidewall surface in contact with the isolation dielectric layer and a plurality of inner fins disposed between the outer fins.

6. The method of claim 5, wherein sidewall surfaces of the inner fins have a taper angle different from a taper angle of the outer fin sidewall surfaces in contact with the isolation dielectric layer.

7. The method of claim 1, wherein the conformal dielectric layer has a thickness of at least half of a width of the gap between two adjacent features.

8. A method of forming a structure, comprising:
   forming a first mask pattern over a first region of a semiconductor substrate;
   forming a second mask pattern over a second region of the semiconductor substrate, wherein the first mask pattern has a plurality of first mask features defining first intra-feature gaps between adjacent features, and the second mask pattern has a plurality of second mask features defining second intra-feature gaps between adjacent features;
   depositing a conformal dielectric layer over the first mask pattern and over the second mask pattern, wherein the conformal dielectric layer completely fills the first and second intra-features gaps;
   removing the conformal dielectric layer from over the semiconductor substrate between the first mask pattern and the second mask pattern, the first mask pattern and remaining portions of the conformal dielectric layer within the first intra-feature gaps defining a first block mask, and the second mask pattern and remaining portions of the conformal dielectric layer within the second intra-feature gaps defining a second block mask;
   etching the semiconductor substrate between the first block mask and the second block mask to form a trench within the semiconductor substrate;
   forming an isolation dielectric layer within the trench;
   removing the conformal dielectric layer from within the first and second intra-feature gaps;

etching the substrate using the first and second mask patterns as an etch mask to form a plurality of fins;

forming a first intrafin isolation layer between adjacent fins within the first region of the semiconductor substrate, wherein the first intrafin isolation layer comprises a p-type dopant; and forming a second intrafin isolation layer between adjacent fins within the second region of the substrate, wherein the second intrafin isolation layer comprises an n-type dopant.

9. The method of claim 8, further comprising etching the first and second intrafin isolation layers to expose upper sidewall surfaces of the fins.

10. The method of claim 8, further comprising removing the first and second mask patterns from over the fins.

11. The method of claim 8, wherein removing the conformal dielectric layer from over the semiconductor substrate between the first mask pattern and the second mask pattern comprises etching isotropically.

12. A method of forming a device, comprising:

forming first and second block masks by depositing a conformal dielectric layer over first and second mask patterns disposed over a semiconductor substrate and removing the conformal dielectric layer from over the semiconductor substrate between the first and second mask patterns, wherein the conformal dielectric layer fills first intra-feature gaps defined by first mask features within the first mask pattern and second intra-feature gaps defined by second mask features within the second mask pattern;

etching the semiconductor substrate between the first block mask and the second block mask to form a trench within the semiconductor substrate;

forming an isolation dielectric layer within the trench;

removing the conformal dielectric layer from within the first and second intra-feature gaps;

etching the substrate using the first and second mask patterns as etch masks to form a plurality of fins;

forming a first intrafin isolation layer comprising a p-type dopant between adjacent fins within a first region of the semiconductor substrate; and forming a second intrafin isolation layer comprising an n-type dopant between adjacent fins within a second region of the semiconductor substrate.

13. The method of claim 12, wherein removing the conformal dielectric layer from over the semiconductor substrate between the first and second mask patterns comprises etching isotropically.

* * * * *